United States Patent [19]

Denissen et al.

[11] Patent Number: 5,757,808

[45] Date of Patent: May 26, 1998

[54] METHOD AND DEVICE FOR USE WITH HELICAL SCAN DATA RECORDING BY IMPLEMENTING A REED-SOLOMON PRODUCT CODE, A UNITARY MEDIUM COMPRISING SUCH DATA, AND A CASSETTE COMPRISING SUCH MEDIUM

[75] Inventors: Adrianus J.M. Denissen; Albert M.A. Rijckaert, both of Eindhoven, Netherlands

[73] Assignee: U.S. Philips Corporation, New York, N.Y.

[21] Appl. No.: 576,552

[22] Filed: Dec. 21, 1995

[30] Foreign Application Priority Data

Dec. 23, 1994 [EP] European Pat. Off. ............ 94203759
Apr. 12, 1995 [EP] European Pat. Off. ............ 95200928

[51] Int. Cl.$^6$ .................................................. G11B 20/18
[52] U.S. Cl. .................... 371/2.1; 371/37.4; 371/40.16
[58] Field of Search ........................... 371/37.4, 40.1, 371/2.1, 39.1, 40.16

[56] References Cited

U.S. PATENT DOCUMENTS 4,630,272  12/1986  Fukami et al. ................... 371/37.4
4,852,102   7/1989  Yamaguchi ........................ 371/2.1
4,882,732  11/1989  Kaminaga .......................... 371/2.2

FOREIGN PATENT DOCUMENTS 0397472  11/1990  European Pat. Off. ..
0658897   6/1995  European Pat. Off. ..
9428546  12/1994  WIPO .

OTHER PUBLICATIONS

Watkinson, *The Art of Digital Video*, pp. 416–434.

*Primary Examiner*—Stephen M. Baker
*Attorney, Agent, or Firm*—Michael E. Belk

[57] ABSTRACT

A method and device for use with helical scan data recording by implementing a Reed-Solomon product code, a unitary medium comprising such data, and a cassette comprising such medium.

Error protective data encoding for use with rotary head helical scan tape-recording is done by providing a first word-wise Reed-Solomon code along each recording track defined in first code words, and a second Reed-Solomon code defined in second code words. The first and second Reed-Solomon codes together form a product code format. Each second codeword has a sequence of symbols across a plurality of contiguous tracks. The symbols of a single second codeword have substantially uniform displacements between contiguous symbols both in a direction parallel to a length of the tape, and also in a direction perpendicular to a length of the tape. Each second codeword extends substantially along a length of the tracks associated to the recording.

21 Claims, 7 Drawing Sheets

METHOD AND DEVICE FOR USE WITH HELICAL SCAN DATA RECORDING BY IMPLEMENTING A REED-SOLOMON PRODUCT CODE, A UNITARY MEDIUM COMPRISING SUCH DATA, AND A CASSETTE COMPRISING SUCH MEDIUM

BACKGROUND OF THE INVENTION

1. Field of the Invention

The invention relates to method for error protective data encoding for use with rotary head helical scan tape-recording by providing a first word-wise Reed-Solomon code along each recording track as being defined in first codewords, and a second Reed-Solomon code as being defined in second codewords, said first and second Reed-Solomon codes collectively forming a product code format.

2. Description Of The Related Art

Such a method has been considered in John Watkinson, The Art of Digital Video, Butterworth Scientific, Borough Green, Kent, UK, 1990, pp. 416–434. Although the helical scan technology has been specifically developed for video, it is also applicable to data recording as well as to audio recording. Various common error patterns are the following:

random errors, that have a limited average size that is not much larger than a symbol, so that a random error does not directly influence the error protection capability for a neighboring random error;

across-tape or lateral burst errors (FIG. 4.2) that may be caused by mechanical parts which extend across the tape, so that a kind of tape fold may occur;

helical burst errors (FIG. 4.3) that are caused by the rotary head motion and therefore make a small deviation angle with respect to the tape motion;

longitudinal burst errors that may be caused by capstan deformations and the like, which may cause a series of errors at uniform lateral positions.

The width of a burst region is generally small with respect to its length. However, the width may be of the same order of magnitude or larger than the width of a single storage track. Now, the occurrence of a burst, once incorrectible or miscorrected, is very degrading to the overall performance of the system.

SUMMARY TO THE INVENTION

Accordingly, among other things, it is an object of the present invention to provide for a substantially uniform level of error protection for all types of burst errors, including lateral burst errors, against only a low overhead penalty, and independent of the location of the burst. Now, according to one of its aspects, the invention is characterized by providing each second codeword as a sequence of symbols across a plurality of tracks, while providing said symbols of a single second codeword with substantially uniform displacements between contiguous symbols both in a first direction parallel to a length of said tape, and also in a second direction perpendicular to a length of said tape, each second code word extending substantially along a length of said tracks associated to said recording. Herein, the term contiguous in a particular direction means the direct succession of the projections of those symbols on an axis along the direction in question. Substantially uniform displacements imply a restricted ratio between the maximum and minimum displacement values, respectively. In the embodiments, this ratio is about 2 (FIG. 6a), or even quite close to 1 (FIG. 6), the choice depending on other storage requirements. Due to the fact that in most cases only two layers of error correction codes need to be provided, the error protectivity is sufficient at only a reasonable amount of overhead. In particular, because the spacing between symbols of the second codeword is uniform in each of the two cited directions, the load of both lateral and longitudinal error bursts is distributed substantially uniformly over the pertaining second codewords, which provides near-optimum protectivity. One solution is through appropriate cross-track shift of symbols within a relevant product code block. This will provide for good distribution of the error protectivity, so that overloading of this protectivity will occur only rarely.

In practice, the expression with "substantially uniform displacement between contiguous symbols in a direction perpendicular to a length of said tape" means that such displacement has a single uniform value when the position of the next symbol is on the next following track, or the next preceding track. When the final track pertaining to the codeword in question has then been reached, the next symbol jumps back to the track at the other side of the bundle. According to the invention, such jump will not cause a forward jump that is much larger than in the former case. Such much larger jump could have led indeed to an uneven distribution of the error load. On the other hand, the jump could be smaller or even be a jump backward in the direction of the tape. The solutions of the invention will lead to the excessively uneven distribution of the error load, supra. In the methodology as recited, bursts or scratches in various directions are coped with in an efficient manner by one and the same protection system. The plurality of tracks may be physically contiguous or not, depending on further requirements. Generally, if spaced, the spacing would be uniform.

Advantageously, the method provides, along a single track, respective symbols of a single second codeword with substantially uniform displacements between contiguous symbols. This is a further trick for load equalizing in the same sense as referred to above. Clearly, such single track has only a fraction of all symbols of such second code word.

Advantageously, each first codeword pertains to a contiguous succession of symbols on an associated single track. This allows for a low-complexity decoding with low storage requirements for the first code encoding/decoding. On the other hand, the words of the first code may be interleaved on their associated single track.

Advantageously, said first and second Reed-Solomon codes are the exclusive error protection codes on a storage system level. Due to the uncomplicated error protection format, only low overhead is required for good error protection. Of course, apart from the storage system level, certain critical information may be protected on an application layer level, but this latter protection would be transparent for the encoding and decoding according to the present invention.

Advantageously, the method foresees, for encoding auxiliary information pertaining to said plurality of tracks, using similar formatting parameters as for said data, but for shortening an area preserved for said auxiliary information through a uniform self-interleaving among the second codewords pertaining thereto. The reliable quality used for the main data recording can now be used as well for audio or other information in parallel to the video. Herein, similar formatting means adhering to the advantageous spacing of the codewords relative to the various types of error bursts (see the A,B bands in FIGS. 4, 6). Of course, the lengths of the codewords, as well as their numbers could be adapted to the size of the available storage area.

The invention also relates to an encoding device, a decoding device, a digital video recorder comprising an encoder or decoder according to the invention, to a unitary storage medium loaded with the error protection format according to the invention, in particular, but not exclusively, a magnetic tape, and to a digital video cassette loaded with such unitary storage medium.

BRIEF DESCRIPTION OF THE DRAWINGS

Now, these and other aspects and advantages of the invention will be discussed hereinafter in detail with reference to the preferred embodiments, and in particular with reference to the appended drawing, wherein.

DESCRIPTION OF THE PREFERRED EMBODIMENTS

Figure 1:
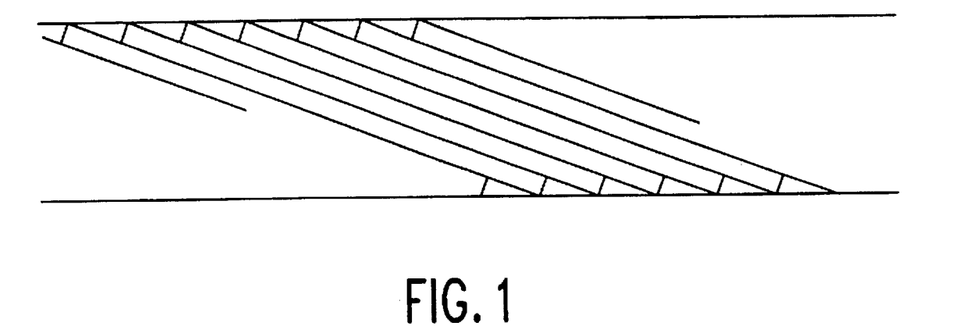
FIG. 1 schematically indicates the tape track disposition.

FIG. 1 schematically indicates the tape track layout. Apart from the digital storage of the information, the layout format may correspond to the well-known VHS standard for analog video recording. During write and read operations, the tape moves horizontally with respect to the recorder head structure. Moreover, the rotary head rotates which results in a component in the vertical direction with respect to the tape in the Figure. The two motions combine in that successive tracks, shown as slanting strips, are each scanned by an associated head during a sweep that is longitudinal with respect to the track. For convenience, many details and different solutions regarding the scanning are ignored here. The slanting angle may be about 6°. Each track contains a single series of contiguous bits. With respect to a preferred embodiment for video recording, the digital storage format should be backwards compatible to the well-known VHS standard. According to this standard, successive tracks have their scanline synchronization pulses aligned in the cross-track direction, which dictates a longitudinal offset between scan-lines on contiguous tracks. This will avoid interference caused by a synchronization pulse of a track on the video signal of an adjacent track: this interference would otherwise be caused by a less than infinite electrical signal separation between adjacent tracks. For digital video recording, this inter-track synchronizing preferably means that on adjacent tracks, respective MPEG data packages should be aligned as well.

Figure 2:
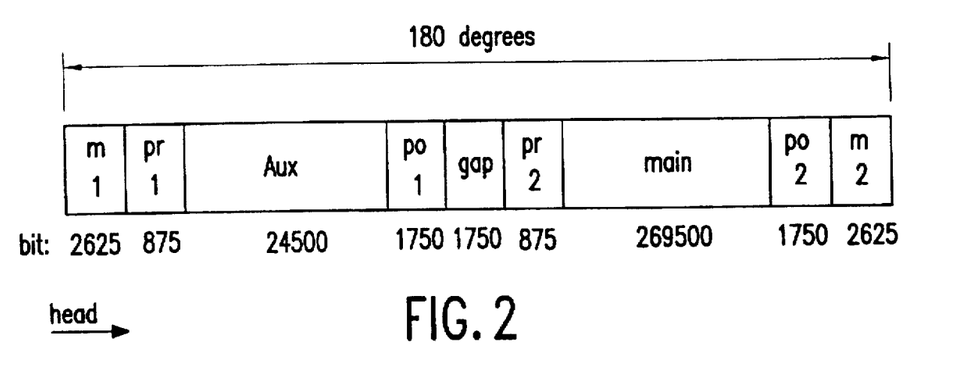
FIG. 2 shows an exemplary track format sector arrangement.

FIG. 2 shows an exemplary track format sector arrangement. Along the scanning motion of the head, the sequence is margin, 2625 bits, preamble, 875 bits, auxiliary information, 24500 bits, postamble, 1750 bits, edit gap, 1750 bits, preamble, 875 bits, main information, 269500 bits, postamble, 1750 bits, and margin, 2625 bits. The total amount of information is 306250 bits per track. The lengths of the various parts as drawn along the track are not true to scale. The physical slant of a track is 5.93538°, the width of a track is 0.029 mm, and the length of the part 'main' is 84.7 mm. Hereinafter, only the part main contains the video data. The part aux contains other data, such as audio. In the embodiment, the error protectivity of the video is based on a series of twelve contiguous tracks. The error protectivity for the audio is based on the same principles as that of the video, but with different parameter values. One particular property of the audio format may be that a single video channel is accompanied by two audio channels in parallel. This may mean that six contiguous tracks in the audio part would contain one audio block, that could be subject to separate editing from the other audio channel of the same video block as well as of the adjacent video block. For brevity, the audio format will not be considered in detail hereinafter. The other parts of the storage accommodate various operational delays of the hardware and often, do not need the high-level error protection according to the present invention.

Figure 3:
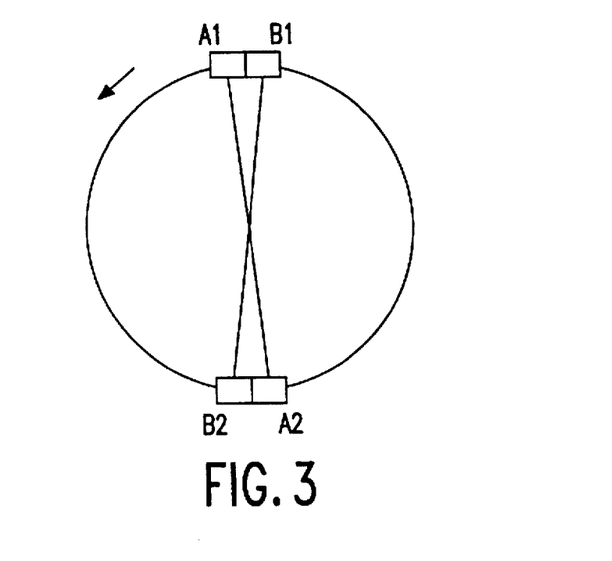
FIG. 3 shows a scanner example.

FIG. 3 shows a scanner example. In the recorder, the tape is wrapped over about 180° of the drum of 62 mm diameter. The lead angle gives the slanting orientation of the drum with respect to the tape. Due to the motion of the tape with respect to the drum, the effective slant angle of the tracks is a few percent different from the slanting orientation of the drum. As indicated, the drum carries four different heads that access two tape tracks at a time, four tracks per full rotation.

Figure 4:
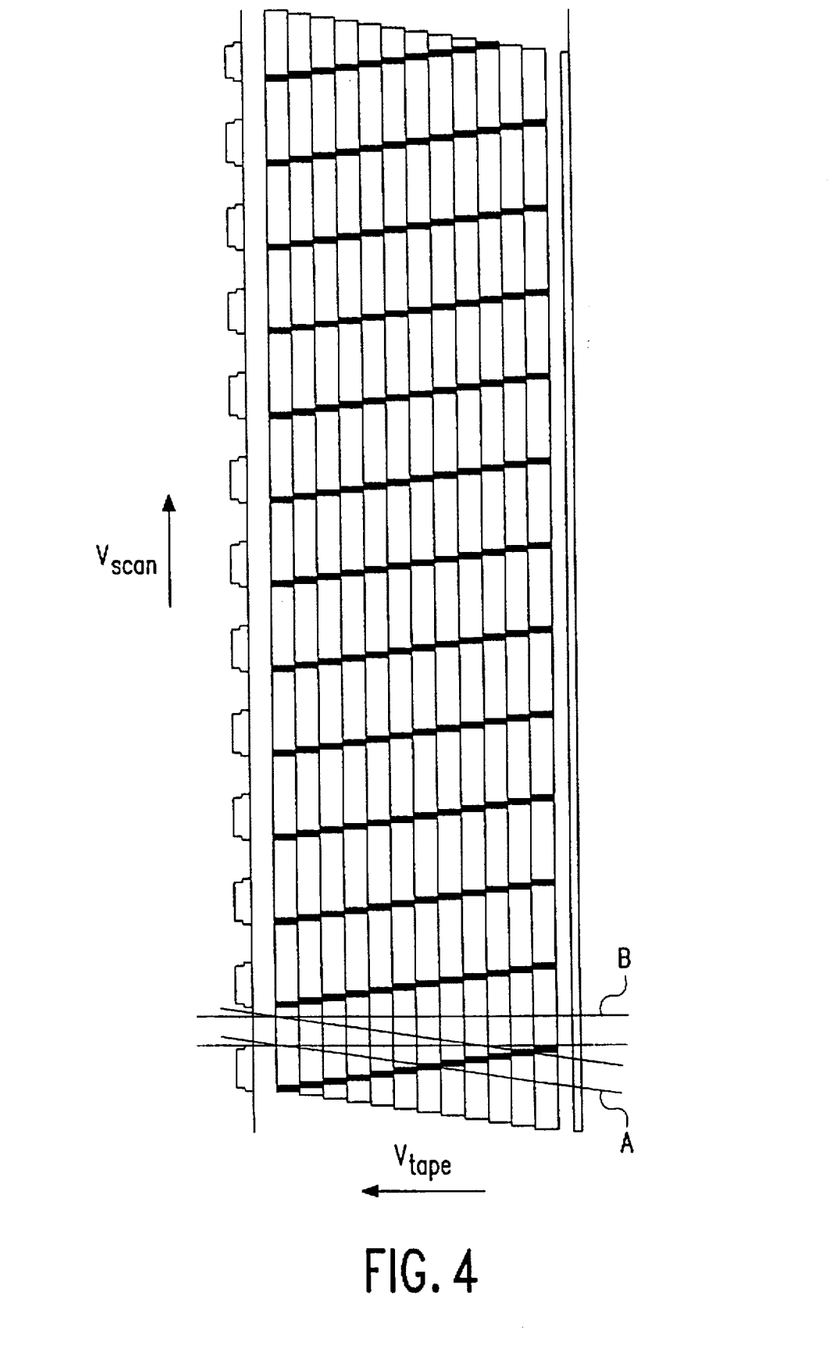
FIG. 4 shows a first code format according to the invention.

FIG. 4 shows a first code format. The code is a product code based on shortened Reed-Solomon codes defined over the Galois Field GF(256). The Figure shows a series of twelve tracks, of which the information forms twelve respective product code blocks, of which only a single one has been highlighted by darkening. For clarity of the Figure, the slant angle of the tracks has been increased to nearly 90°, which however has no influence on the lateral coordinates of the various symbols with respect to the tape. Now, each word of the first or C1 code is disposed longitudinally along a single track: each dark block indicates the length of a single 205 byte error protected C1 codeword which is separated from the next dark block by 11 further C1 codeword positions shown in white. Each dark block furthermore contains five system bytes (sync/ident) not considered further for brevity. The number of C1 codeword on a single track is 154. Now, the second or C2 codewords pertaining to the dark C1 code words are disposed along the staggered positions of the dark blocks shown. In consequence, the array of dark blocks represents 205 C2 codewords of 154 bytes each, that together form a single comprehensive product code block. The white codewords in similar fashion are grouped into 11 further product code blocks. The total number of bytes on the tape section shown is therefore equal to 205X154X12. The minimum distance of the C1 code is 12, the minimum distance of the C2 code is 14. The error protection overhead for C1+C2 is about 15%, which was found acceptable, both for the object of attaining a favorable data rate, and for realizing a simple two-level decoding strategy. Indeed, according to the invention, no further error protection was deemed necessary on the level of the storage system.

Figure 5:
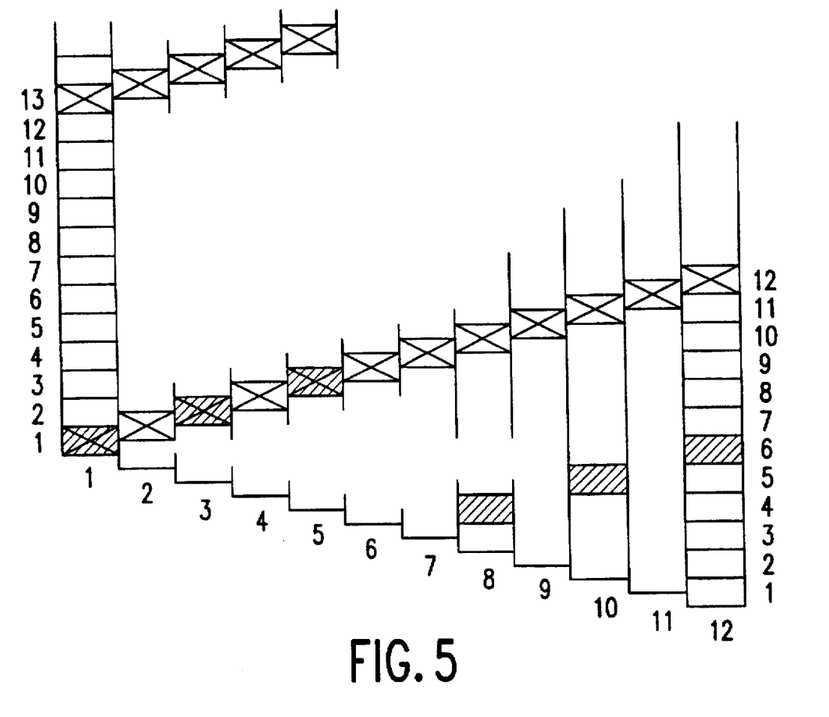
FIG. 5 is an enlarged detail of FIG. 4.

FIG. 5 is an enlarged detail of a part of FIG. 4, with the dark blocks of FIG. 4 now shown as crossed blocks. On track 1 it is the first block, on track 2 the second, and so on, until the twelfth on track 12. The next block of this same product code format then is the 13th on track 1. So the cross-track shift of each next block, and also of each next symbol in a C2 codeword, is one track, modulo the number of tracks in the block, 12. Therefore, the C2 codewords extend virtually over the full track part that is used for the type of data considered here (video versus audio).

The error correction capability has been found sufficient for random errors, for longitudinal burst errors, as well as for in-track burst errors. This is shown in FIG. 4 where band A symbolizes the region of a longitudinal burst error strip. Band A runs exactly parallel to the tape edge, and also parallel to the ends of the successive tracks. This means that the counterclockwise rotation of the tracks to regain their real orientation always keeps this band parallel to the edge of the tape. Moreover, shifting of this band across the tape will always cause a uniform intersection pattern with respect to the succession of dark blocks: regardless of the lateral position, always about four of the dark blocks will lie inside a band. Of course, this number is proportional to the width of the burst. The uniformity of the intersection pattern ensures the best spread of the errors over the protectivity that can be attained with the given amount of redundancy.

The error protection against lateral burst errors is non-uniform, however. This is shown in FIG. 4 by band B, which is not fully parallel to the tape edge, but has a small inclination. In the Figure, the inclination angle appears to be a few degrees only (say 5°), but due to the clockwise rotation of the tracks, combined with the change of their lengths relative to the tape width, the real inclination of this error band B is nearly exactly orthogonal to the longitudinal direction of the tape. Therefore, this band corresponds to the position of a lateral error burst. Now, in the situation shown, error band B does not touch the C2 codewords represented by the dark blocks, but only C2 codewords present in the white area. The same would apply for all bands that have a smaller width inside band B as shown. Such smaller width is quite common. The situation shown implies that the error performance of the various C2 codewords is often taxed by lateral burst errors in a non-uniform manner: either not at all, or quite heavily. Such concentrating the error pattern on a fraction of the codewords gives less than the optimum protectivity, inasmuch as the burden is imperfectly shared among the C2 codewords. Note that in the Figure, band B may be shifted parallel to itself, while still retaining its near orthogonality with respect to the 'real' tape length. Note also that the same problem will occur if the orientation of band B varies a little bit, so that the same problem could occur over a rather wide range of inclinations of the error burst with respect to the tape length.

Figure 6:
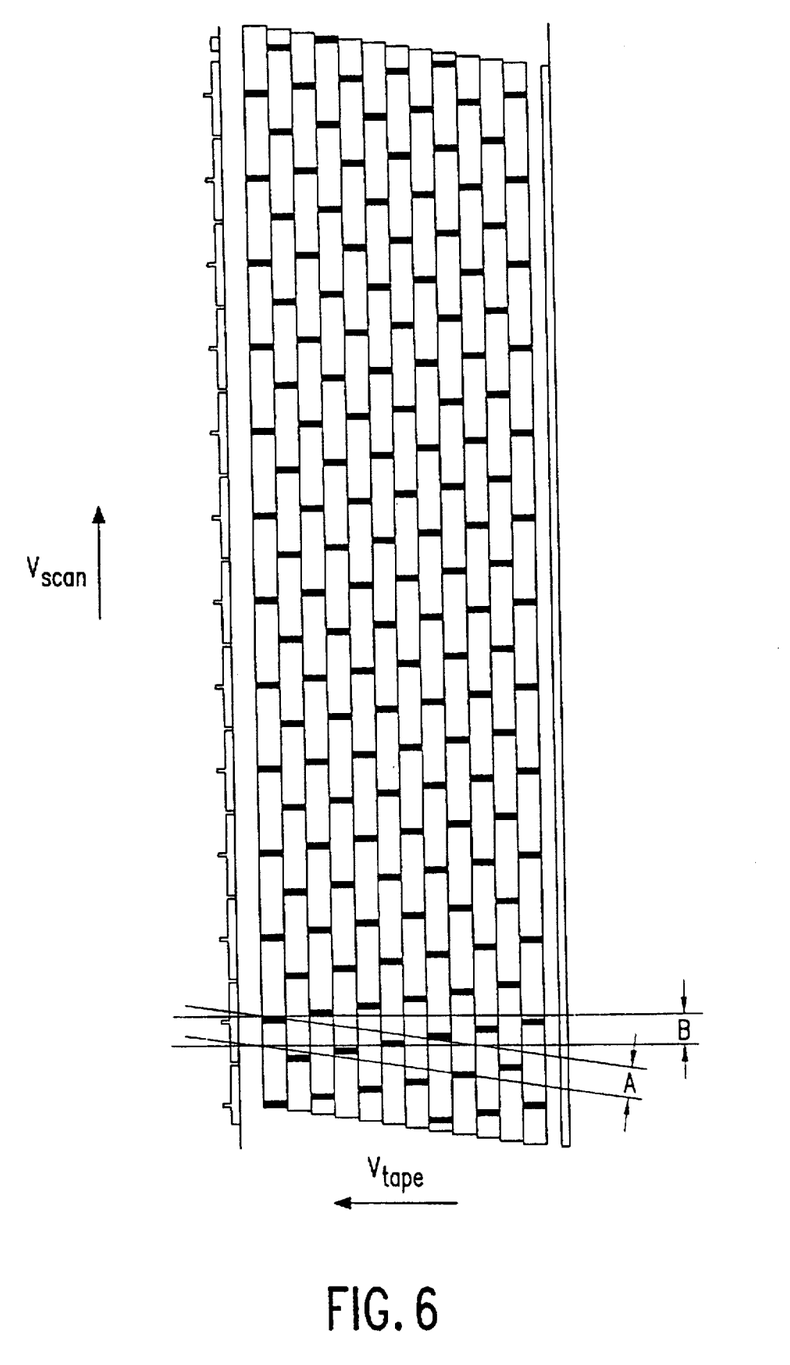
FIG. 6 shows another code format according to the invention.

In this respect, FIG. 6 shows another code format according to the invention. Now, the same dark blocks of FIG. 4 have been randomized more over the area shown. One method to realize this is to rotate the even numbered tracks over half the track width of the overall block, therefore over 6 tracks. This corresponds to a cross-track shift of each next symbol of a codeword by 7 (seven) tracks. In FIG. 5, the first six blocks of this amended product code format have been shown hatched. Again the same two error bands, A B of FIG. 4, have been shown in FIG. 6, proving that for both these bands, the errors are now distributed more uniformly over the various C2 codewords. The reason is that the uniformly shifted positions of the dark blocks in FIG. 4 had the effect of a series of theatrical side-wings or shutters that are transmissive in certain directions, but opaque in others, at least one of these directions representing an often occurring burst error pattern. In practice, the randomizing must be done in a systematic way as exemplified in FIG. 6. The Figure realizes indeed a minimum symbol-to-symbol displacement in a direction perpendicular to the length of the tape. In the situation shown, this also realizes minimum codeword-to-codeword displacement in a direction perpendicular to the tape length of the C2 code.

Figure 8:
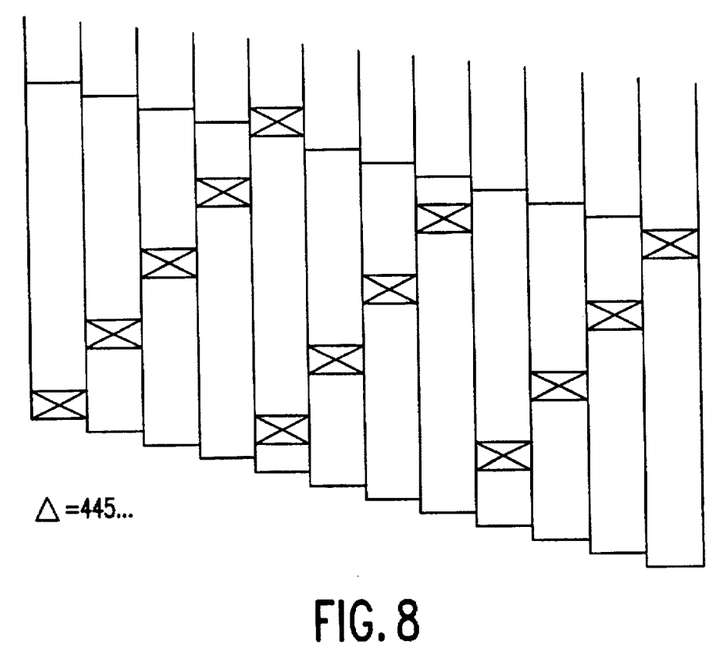
FIG. 8 shows a first variation on FIG. 6.
Figure 9:
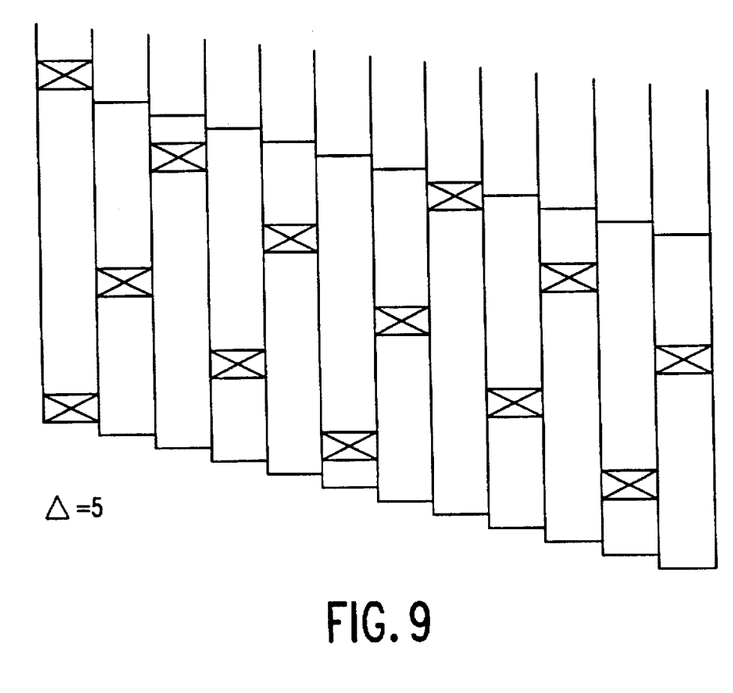
FIG. 9 shows a second variation on FIG. 6.

According to the foregoing, the cross-track shift of the C2 codewords uniform values +1 in FIG. 4, and +7 in FIG. 6. The further Figures give other possibilities that are slightly worse than FIG. 6, but better than FIG. 4. Here, the cross-track shifts are, respectively:

a. 445445445445 (nonuniform): FIG. 8 shows this first variation on FIG. 6;
b. 555555555555 (uniform): FIG. 9 shows this second variation on FIG. 6.

Many other combinations fall within the scope of the present invention. These and other shifts between successive code symbols can be expressed as well in other ways as rotations of the separate tracks along their respective lengths. Certain ones of these rotations, from their part, cannot be so easily expressed in the formalism according to the above, but would still fall within the scope and object of the present invention.

Figure 6A:
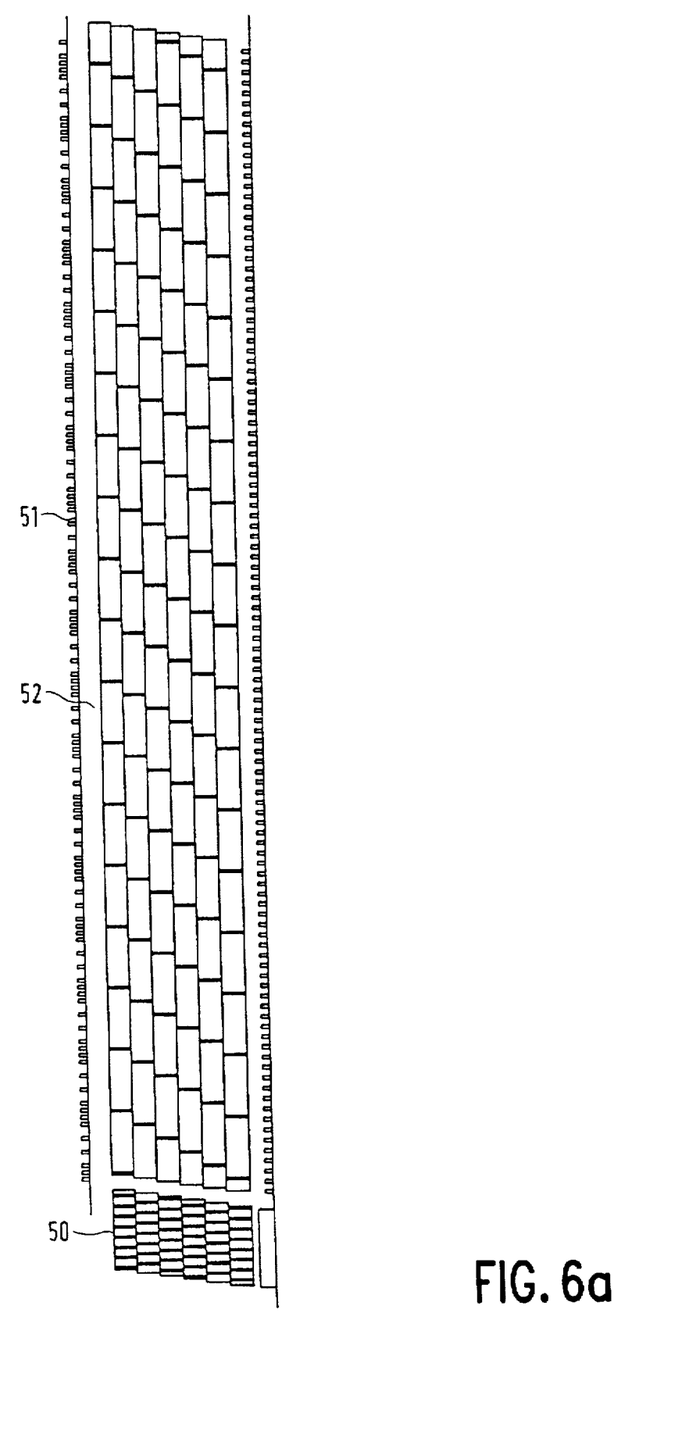
FIG. 6a shows still another code format according to the invention.

FIG. 6a shows still another code format according to the invention. Here the number of tracks pertaining to a particular C2 codeword is only six. This lowering of the number of tracks diminishes the storage requirements in the recorder, that would be necessary for encoding and decoding, respectively. Again, the cross-track shift has been chosen relatively prime to the number of tracks. A number of five was found as optimum. This causes an apparent "staircase" pattern in the opposite direction compared with FIG. 4. In contradistinction to FIG. 4, there is no B-type gap between successive staircases. Successive staircases do rather overlap, in that the first symbol of a next staircase lies between the last two stairs of the previous staircase. Even so, this provides for a more even sharing of the error burden from a cross-track burst among various C2 codewords.

Hereinafter, the code format is briefly explicited in formulae for better understanding. The so-called inner code is restricted to a single track, without interleaving as follows: one inner codeword is made of following symbols.

$$\text{Codeword}(t,s) = \sum_{d=0}^{106} \text{Data}_{t,s,d} \times X^{(106-d)}$$

(t=0 . . . 5, s=0 . . . 335)
where: $\text{Data}_{t,s,d}$ means a symbol which position is track number: t, sync block number: s, and data byte number: d.

Last 8 symbols (d=99 . . 106) are parity.

This equation indicates the inner codeword which position is track number: t and sync block numbers: s.

Generator polynomial for inner error correcting code is as follows.

$$G(X) = \prod_{i=0}^{7} (X + \alpha^i)$$

On the other hand, the outer code is interleaved among six tracks, as follows:
One outer codeword is made of following symbols $$\text{Codeword}(t,s,d) = \sum_{i=0}^{111} \text{Data}_{T,S,D} \times X^{(111-i)}$$

(t=0 . . . 5, s=0 . . . 2, d=0 . . . 98)
where: the variable i means the order of symbols in the codeword.
T=(t+5×i) mod6

S=s+3×i
D=d $Data_{T,S,D}$ means a symbol which position is track number: T, sync block number: S, and data byte number: D.

Last 10 symbols (i=102 .. 111) are parity.

This equation indicates the outer codeword which the first symbol position is track number: t, sync block number: s, and data byte number: d.

Generator polynomial for outer error correcting code is as follows.

$$G(X) = \prod_{i=0}^{9} (X + \alpha^i)$$

By way of variation, FIG. 6a also shows a composite format. The code as discussed supra is present in block 52. The band, at indication 54, shows the sequence of the one product code block that is highlighted as being projected perpendicularly to the track direction. The displacement between successive C1 codewords has either single or double size.

Figure 6B:
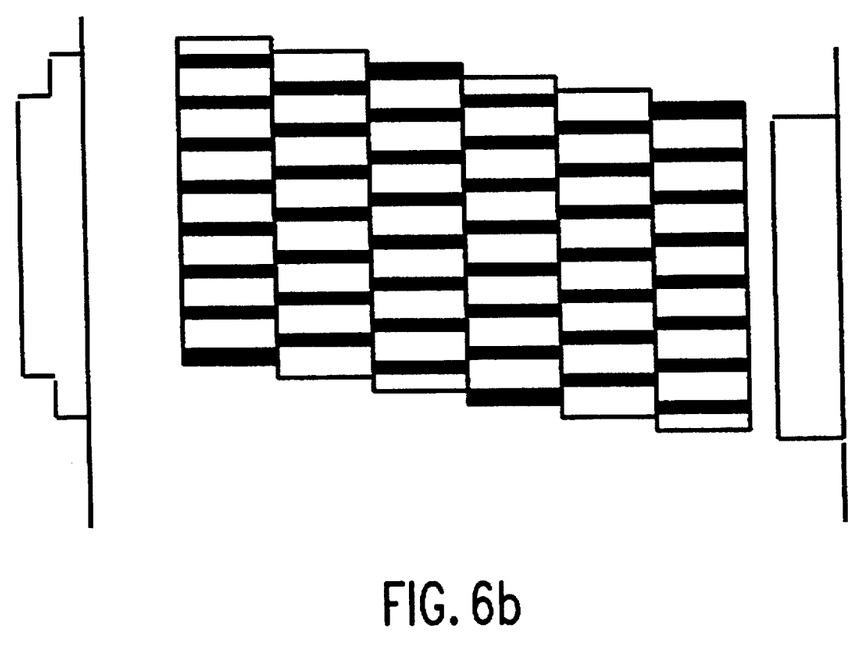
FIG. 6b shows still another code format according to the invention.

Furthermore, the block shown at indication 50 may be superposed on a part of block 52; in the embodiment, it could cover less than 10% thereof. In such case, the symbols of block 52 to be covered by block 50, are identically set to zero. This does not destroy the format of the original code. The additional information of block 50 can relate to non-video data. This format of block 50 has been shown enlarged in FIG. 6b. As shown it could also pertain to the part AUX in FIG. 2: this would obviate the need for the above superposing. Now, the number of tracks is again equal to six, whereas the scale of the Figure has been enlarged in both directions by a factor of three. The black rectangles have uniform sizes, which correspond to those of FIGS. 6, 6a. The seemingly greater width when touching the edges of the tape section is an artefact from the drawing software. For the part AUX, the storage requirements are about a factor of ten smaller than those for the part MAIN. In consequence, a shorter C2 codeword was chosen at a length of 46 symbols and the distance between successive dark blocks on a single track equal to only two such blocks. Therefore, the width of the white areas is equal to twice the width of the black areas. The format has been realized by providing the same displacements as in FIG. 6a, accompanied by interleaving the format among itself. Thus, the format of FIG. 6b is attained by putting further "staircases" between the "staircases" of FIG. 6a, for collectively bringing the number of symbols of a single C2 codeword to the intended level. Just as was the case with FIG. 6a, the load distribution for cross-track error burst will be shared evenly among the various C2 codewords.

In correspondence to the video part in FIG. 6a, the additional code format can be given as follows, for the inner code that is restricted to one single track:

One inner codeword is made of following symbols.

$$\text{Codeword } (t,s) = \sum_{d=0}^{106} Data_{t,s,d} X^{(106-d)}$$

(t=0 .. 55, s=0 .. 22)

where: $Data_{t,s,d}$ means a symbol which position is track number: t, sync block number: s, and data byte number: d.

Last 8 symbols (d=99 .. 106) are parity.

This equation indicates the inner codeword which position is track number: t and sync block number: s.

Generator polynomial for inner error correcting code is as follows.

$$G(X) = \prod_{i=0}^{7} (X + \alpha^i)$$

On the other hand, the outer code is interleaved among six tracks, as follows:

One outer codeword is made of following symbols.

$$\text{Codeword } (t,d) = \sum_{i=0}^{45} Data_{T,S,D} \times X^{(45-i)}$$

(t=0 .. 2, d=0 .. 98)

where: the variable i means the order of symbols in the codeword.

T=(t+3×(i mod 2)+5×int(i/2))mod 6
S=int(i/2)
D=d $Data_{T,S,D}$ means a symbol which position is track number: T, sync block number: S, and data byte number D.

Last 10 symbols (i=36 .. 45) are parity.

This equation indicates the outer codeword which the first symbol position is track number: t, sync block number: 0, and data byte number: d.

Generator polynomial for outer error correcting code is as follows.

$$G(X) = \prod_{i=0}^{7} (X + \alpha^i)$$

Figure 7:
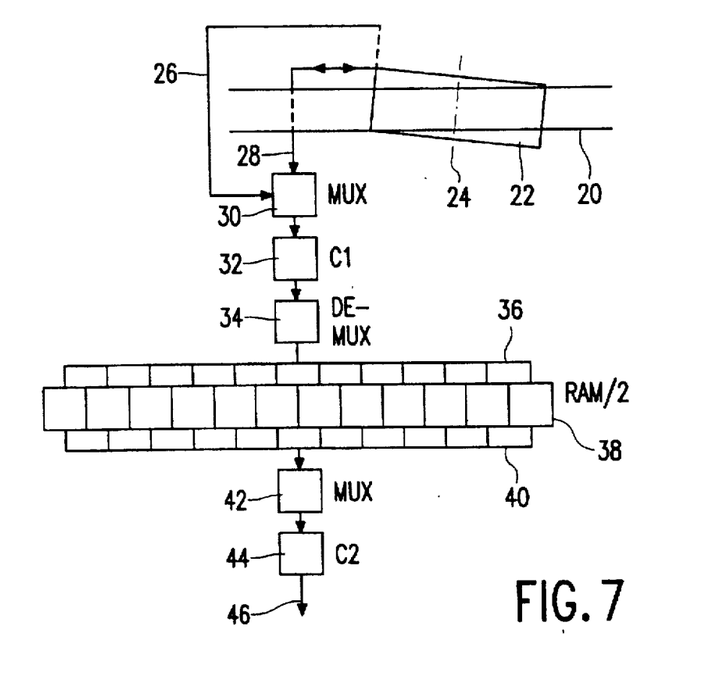
FIG. 7 shows a device for use with the invention.

FIG. 7 shows a device for use with the invention. In this first embodiment, the device would cope with decoding the format of FIGS. 4 or 6. The format of FIG. 6a could do with less required storage, and would also be able to decode the AUX format of FIG. 6b as well.

Various electromechanical subsystems have been omitted for clarity. Upon accessing of tape 20 either for reading or for writing, the latter is driven by a motor (not shown). Drum 22 is rotated around its axis 24, and provided with a detection mechanism 26 that provides a synchronizing signal at full turn intervals. First, the read operations will be described. Interconnection 28 carries the data signals from the four heads. Multiplexer block 30, under synchronization by the pulses on line 26, interconnects the proper head output to the C1 word decoder 32. The C1 decoder first comprises an analog part that synchronizes to preamble pr2 in FIG. 2, in this way effecting the extracting of the encoded bit stream from the raw tape signal. Next, for each C1 codeword, the syndrome symbols are calculated by means of conventional matrix multiplications. When non-zero syndrome symbols indicate an error pattern, decoder 32 undertakes an error correction. To this effect, decoder 32 comprises a sufficient amount of intermediate storage capacity (not shown). Almost universally, this will allow calculating random errors. If burst errors occur, this will generally lead to the detecting and flagging of an incorrectible error pattern. Subsequently, demultiplexer 34, by way of interconnection pattern 36, assigns the symbols of each C1 code word to one of the 12 RAM sectors in RAM 38, that is assigned to the associated a single product code block. The RAM sector may, in consequence, come to contain all dark blocks shown in FIG. 4. Multiplexer 42 thereupon forwards the contents of each respective C2 codeword to decoder 44 that may output the information after correction via output 46. RAM 38 should accommodate the content of twelve full storage tracks to allow for the fullest flexibility in the error correction. During execution of the error correction, the RAM should already start inputting of the next twelve tracks, and also continue outputting of the preceding twelve tracks. In practice, the inventors have found that a capacity of about 17 tracks would be sufficient, if combined with a raised access frequency for the error correction as compared with the access frequency for the write-in from the tape or the read-out to the user. In an enhanced decoder, various higher level strategies may be implemented, such as rerouting after the undertakings in decoder 44 the not yet fully decoded information back to the decoder part of block 32. However, this would not necessitate a higher storage capacity. The decoding of the parts 'main' and 'aux' in FIG. 2 may be effected in substantially the same way, be it that the format of the product code blocks is different. For encoding, the process is effected substantially the other way round. Therefore, block 44 corresponds to an encoder, block 42 to a demultiplexer, block 34 to a multiplexer, block 32 to an encoder, and block 30 to a demultiplexer.

We claim:

1. A method for error protective data encoding for use with rotary head helical scan tape-recording comprising the step:

providing a first word-wise Reed-Solomon code along each recording track as being defined in first codewords, and a second Reed-Solomon code as being defined in second codewords, said first and second Reed-Solomon codes collectively forming a product code format, characterized in that said method further comprises the step:

providing each second codeword as a sequence of symbols across a plurality of tracks, while providing said symbols of a single second codeword with at least a substantially uniform displacement between contiguous symbols both in a first direction parallel to a length of said tape, and also at least a substantially uniform displacement in a second direction perpendicular to a length of said tape, each second codeword extending substantially along a length of said tracks associated to said recording.

2. A method as claimed in claim 1, wherein said plurality of tracks are contiguous tracks.

3. A method as claimed in claim 1, while providing along a single track respective symbols of a single second codeword with substantially uniform displacements between contiguous symbols.

4. A method as claimed in claim 1, for recording video information, wherein said uniform cross-track shift is uniform among all second codewords.

5. A method as claimed in claim 1, wherein each first codeword pertains to a contiguous succession of symbols on an associated single track.

6. A method as claimed in claim 1, wherein said first and second Reed-Solomon codes are the exclusive error protection codes on a storage system level.

7. A method as claimed in claim 1, while for encoding auxiliary information pertaining to said plurality of tracks using similar formatting parameters as for said data, but foreshortening an area preserved for said auxiliary information through a uniform self-interleaving among the second codewords pertaining thereto.

8. A unitary storage medium having data stored thereon that has been encoded according to a method as claimed in claim 1.

9. A digital video cassette comprising a medium as claimed in claim 8.

10. A method as claimed in claim 1, while providing said symbols along said sequence with a uniform symbol-to-symbol cross-track shift that is relatively prime to a value of said plurality.

11. A method as claimed in claim 10, wherein said cross-track shift is greater than one and calculated modulo the value of said plurality.

12. A method as claimed in claim 11, wherein said cross-track shift is one lower than the value of said plurality.

13. A method as claimed in claim 12 wherein within a single track, successive first codewords are cyclically assigned to respective product code blocks with a cycle length that is equal to the value of said plurality.

14. A device for error protective encoding having an output for feeding a rotary head for helical scan track-wise recording by providing a first word-wise Reed-Solomon code along a recording track defined in first codewords and a second Reed-Solomon code defined in second codewords, said first and second Reed-Solomon codes collectively forming a product code format, characterized in that said device comprises encoder means for encoding each said second codeword as a sequence of symbols across a plurality of tracks;

disposing means for disposing in said sequence said symbols with a substantially uniform symbol-to-symbol displacement both in a first direction parallel to a length of said tape, and in a second direction perpendicular to a length of said tape; and extending means for extending each second codeword to a size substantially equal to a length of said tracks associated to said recording.

15. A device as claimed in claim 14, wherein said disposing means comprises means for disposing, along a single track, the symbols of a single second codeword with substantially uniform displacements between contiguous symbols thereof.

16. A device as claimed in claim 14, wherein said encoders within a single tracks assigns symbols cyclically to respective product code blocks with a cycle length that is equal to the number in said plurality.

17. A device as claimed in claim 14, wherein said device further comprises secondary encoding means for encoding auxiliary information pertaining to said plurality of tracks using similar formatting parameters as for said data, but for shortening an area preserved for said auxiliary information through a uniform self-interleaving among the second codewords, pertaining thereto.

18. A digital video recorder comprising a device as claimed in claim 14.

19. A device as claimed in claim 14, for use in recording video information, wherein said disposing means comprises means for disposing said symbols along said sequence with a uniform cross-track shift that is relatively prime to a value of said plurality.

20. A device as claimed in claim 19, wherein said uniform cross-track shift is greater than one and calculated modulo the value of said plurality.

21. A device for error protective decoding of digital video data having an input for connecting to a rotary head for helical scan track-wise scanning tape information that is protected by a first word-wise Reed-Solomon code along a recording track defined in first codewords and a second Reed-Solomon code defined in second codewords, said first and second Reed-Solomon codes collectively forming a product code format, characterized in that said device comprises decoder means for decoding each said second codeword as a sequence of symbols disposed across a plurality of tracks, while reading said symbols of a single second codeword with a uniform symbol-to-symbol displacements between contiguous symbols both in a first direction parallel to a length of said tape, and also in a second direction perpendicular to a length of said tape, and reading each second codeword along an extension substantially equal to a length of said tracks associated to said digital video data.

* * * * *